United States Patent [19]

Goldsmith et al.

[11] 3,945,864

[45] Mar. 23, 1976

[54] METHOD OF GROWING THICK EXPITAXIAL LAYERS OF SILICON

[75] Inventors: Norman Goldsmith, East Brunswick; Paul Harvey Robinson, Trenton, both of N.J.

[73] Assignee: RCA Corporation, New York, N.Y.

[22] Filed: May 28, 1974

[21] Appl. No.: 473,766

[52] U.S. Cl. ............... 148/175; 156/17; 156/611; 156/612; 156/613; 423/349; 423/350
[51] Int. Cl.² ............ H01L 21/205; H01L 21/302; C01B 33/02
[58] Field of Search ........ 148/174, 175; 117/106 A, 117/201; 156/17, 611–613; 423/348–350

[56] References Cited

UNITED STATES PATENTS

| | | | |
|---|---|---|---|
| 3,243,323 | 3/1966 | Corrigan et al. | 148/175 |
| 3,501,336 | 3/1970 | Dyer et al. | 117/106 A |
| 3,512,056 | 5/1970 | Chu et al. | 148/175 X |
| 3,661,637 | 5/1972 | Sirtl | 117/106 A |

OTHER PUBLICATIONS

Lekholm, A., "Epitaxial Growth of Silicon From Dichlorosilane" J. Electrochem. Soc. Vol. 119, No. 8, Aug. 1972, pp. 1122–1123.
DeLong, D. J., "Advances in Dichlorosilane Epitaxial Technology" Solid State Technology, Oct. 1972, pp. 29–41.
Dyer et al., "Autodoping—Silicon Epitaxial Manufacturing Processes," *Semiconductor Silicon* 1973, Second International symp. - May 1973, pp. 201–212.
Suzuki et al., "Properties of High-Purity Si Epitaxial Layers" IBID., pp. 191–200.
Chiang et al., "Growth of Homoepitaxial Silicon— Mixtures" Metallurgical Transactions, Vol. 2, Mar. 1971, pp. 743–746.

*Primary Examiner*—L. Dewayne Rutledge
*Assistant Examiner*—W. G. Saba
*Attorney, Agent, or Firm*—H. Christoffersen; T. H. Magee

[57] ABSTRACT

Epitaxial layers of silicon, having thicknesses of at least about 25 $\mu$m, are grown on the (100) or (111) planar surfaces of silicon substrates by the vapor deposition of silicon from the reaction of dichlorosilane and hydrogen gas in a reactor furnace. Good epitaxial layers of silicon of substantially uniform thicknesses are formed on the substrates when the growth rate of the epitaxial layer is between about 5 and 20 $\mu$m/minute in the reactor furnace, and the latter is heated to a temperature of between about 1050° and 1200°C.

4 Claims, No Drawings

METHOD OF GROWING THICK EXPITAXIAL LAYERS OF SILICON

This invention relates generally to a method of growing epitaxial layers of silicon on silicon substrates. More particularly, the invention relates to a method of growing an epitaxial layer of silicon, having a thickness of at least about 25 μm, on the surface of either a (100) or (111) plane of a substrate of single-crystal silicon. The novel method is particularly useful in the manufacture of semiconductor power devices where relatively thick layers of epitaxial silicon of good crystallographic quality are desired.

Epitaxial layers of silicon, with thicknesses greater than 25 μm, that have been grown on the (100) or (111) planes of silicon substrates by prior-art methods, as by the reduction of silicon tetrachloride or trichlorosilane with hydrogen gas, exhibit crowns, or raised portions, of epitaxial silicon around the circumferences of the substrates. These crowns of deposited silicon must be removed from the substrates, usually silicon wafers, by a manual grinding operation before further photolithographic processing may follow on the epitaxial silicon. In addition to the grinding operation being costly in time, it also destroys a part of the epitaxial silicon deposit. Also, with the aforementioned prior-art methods, the growth rates of the epitaxial silicon deposits are in the order of about 2 μm/minute or less. If higher growth rates are used, the crystallographic quality of the epitaxially deposited silicon is degraded.

In accordance with the novel method, a layer of epitaxial silicon is deposited on a silicon substrate by the hydrogen reduction of dichlorosilane at a growth rate of at least 5 μm/minute. Under these conditions, layers of epitaxial silicon of very good crystallographic quality, having thicknesses in excess of 25 μm, can be grown on single-crystal silicon substrates. Briefly, the novel method of growing a relatively thick epitaxial layer of silicon, of substantially uniform thickness, on a surface of either the (100) or (111) plane of a substrate of single-crystal silicon comprises (a) heating the substrate to a temperature of between about 1050° and 1200°C in a reactor furnace, (b) etching the surface of the substrate in the reactor furnace with HCl gas in a carrier gas, (c) purging the reactor furnace of the HCl gas, and (d) reacting dichlorosilane and hydrogen gas in the reactor furnace to grow the epitaxial layer of silicon at a growth rate of at least 5 μm/minute.

In one embodiment of the novel method, the reactor furnace is purged by cutting off the supply of HCl gas to the reactor furnace and reducing the velocity of the carrier gas to about 1/10 of its velocity during the etching operation, until all of the HCl gas is removed from the reactor furnace.

In another embodiment of the novel method, the reactor furnace is purged by cutting off the supply of the HCl gas, dropping the temperature of the reactor furnace about 300°C from its previous temperature, and maintaining the flow of the carrier gas through the reactor furnace at the same velocity it flowed during the etching operation.

The novel method of growing relatively thick epitaxial layers of silicon on surfaces of single-crystal silicon substrates can be carried out in a reactor furnace of conventional design. The reactor furnace can be either a vertical, a horizontal, or a pancake type, for example, of the kind commonly used in the semiconductor device processing art. The novel method hereinafter to be described in detail will be explained, by way of an example, with respect to a horizontal type epitaxial reactor furnace wherein gases are directed through a tube, about 2 inches (5.08 cm) high, 4 inches (10.16 cm) wide, and having a heated length of about 12 inches (30.48cm). Substrates of single-crystal silicon to be coated with a relatively thick layer of epitaxial silicon are usually wafers disposed on a silicon carbide coated graphite susceptor that is heated by rf induction, in a manner well known in the art.

Processing gases that pass through the reactor furnace are metered for flow, and their temperature within the reactor furnace is measured with an optical pyrometer.

The surface of the single-crystal silicon substrate, upon which the epitaxial layer of silicon is to be deposited, must be polished and cleaned before the epitaxial deposition. The surface is polished to remove any imperfections thereon, resulting from the cutting and/or sawing of the substrate from a crystal boule, and to provide a substantially smooth flat surface. The cleaning is accomplished by washing the surface, preferably with a solution of water, hydrogen peroxide, and ammonia in the ratio of about 4:1:1. Other suitable cleaning solutions known in the art may also be used.

The substrate is heated in a reactor furnace to a temperature of between about 1050° and 1200°C. The surface of the substrate is then etched to remove between 1 and 5 μm of it, whereby to remove any silicon dioxide that may have formed on the surface and to provide a virgin receptive area upon which a layer of silicon is to be epitaxially deposited. The etching operation of the surface is accomplished by passing a mixture of gases through the reactor furnace. The mixture of gases comprises about 1% HCl gas and a carrier gas such as 99% hydrogen gas, by volume, flowing through the reactor furnace at a velocity of about 20cm/second (calculated for normal pressure, 760 mm, and temperature, 25°C). All of the velocities mentioned herein and in the appended claims are calculated for normal pressure and temperature.

After the surface of the substrate is suitably etched, the reactor furnace is purged of the HCl gas. The purging of the reactor furnace is an important operation of the novel method in that it substantially removes or minimizes the boundary layer of gas on the surface upon which the epitaxial silicon is to be deposited. Under such conditions, a more rapid removal of the etching products (normally trapped in the boundary layer) is obtained. In accordance with one embodiment of the novel method, the reactor furnace is purged by cutting off the HCl gas in the mixture of HCl gas and hydrogen gas, and then reducing the velocity of the hydrogen gas flowing through the reactor furnace to about 1/10 of the velocity used in the aforementioned etching operation. Thus, if the etching operation is done with a flow of the (carrier) hydrogen gas (in the mixture of HCl gas and hydrogen gas) through the reactor furnace at a velocity of 20cm/second, the rate of flow of hydrogen gas is reduced to a velocity of 2 cm/second, until all of the HCl gas is purged from the reactor furnace. In another embodiment of the novel method, the reactor furnace is purged by cutting off the supply of HCl gas from the mixture used in the etching operation, then lowering the temperature within the reactor furnace 300°C from its previous temperature, while maintaining the flow of hydrogen gas through the reactor furnace at the same velocity used in the etching operation. Hence, in this last-mentioned embodiment, the velocity of flow of hydrogen gas through the reactor furnace is 20 cm/second. When all of the hydrogen chloride (HCl) gas is purged from the reactor furnace, the temperature of the furnace is brought back to its originally heated temperature, that is, between about 1050° and 1200°C.

The epitaxial layer of silicon is deposited onto either the (100) or the (111) plane of the heated surface of the substrate by the reaction of dichlorosilane and hydrogen gas in the heated reactor furnace. To this end, a mixture of dichlorosilane and hydrogen gas is introduced into the reactor furnace at a velocity of about 20 cm/second and in a concentration to cause the deposition of silicon (due to the reduction of the dichlorosilane) epitaxially onto the etched and heated surface of the substrate at a rate of growth of between about 5 and 20 $\mu$m/minute. To accomplish this, the concentration of dichlorosilane in the mixture of dichlorosilane and hydrogen gas should be between about 2 and about 15 mole percent when reacted at the aforementioned temperatures (1050°C and 1200°C).

An important feature of the novel method is the rate of growth of the epitaxial layer of silicon on the surface of the substrate. Unless the growth rate is at least 5 $\mu$m/minute, a raised portion of deposited silicon, in the form of a crown, tends to form adjacent to periphery of the substrate. When however, the growth rate of the epitaxial layer of silicon is between 5 and 20 $\mu$m/minute, a layer of epitaxial silicon, with a substantially uniform thickness of at least 25 $\mu$m, can be deposited on either the (100) or (111) plane of the substrate, thereby requiring substantially no further processing with respect to the thickness of the deposited epitaxial silicon layer.

What is claimed is:

1. A method of growing an epitaxial layer of silicon, having a thickness of at least about 25 $\mu$m, on a surface of either a (100) or (111) plane of a substrate of single-crystal silicon, said method comprising the steps of:

heating said surface to a temperatue of between about 1050°C and about 1200°C in a reactor furnace, etching said surface in said reactor furnace by passing a mixture of gases through said reactor furnace, at a velocity of about 20 cm/second, to remove a portion of said surface, said mixture of gases comprising about 1% HCl gas and about 99% hydrogen gas, by volume, purging said reactor furnace of said HCl gas by cutting off the supply of HCl gas in said mixture and either reducing the velocity of hydrogen gas or dropping the temperature in said reactor furnace until substantially all of said HCl gas is removed from said furnace, and introducing dichlorosilane and hydrogen gas into said reactor furnace, at a temperature of between about 1050°C and 1200°C, in a concentration to react said dichlorosilane with said hydrogen gas to grow said epitaxial layer of silicon on the etched surface at a rate of between about 5–20 $\mu$m/minute.

2. A method of growing an epitaxial layer of silicon as described in claim 1, wherein:

said surface is polished to a planar flat surface and cleaned by washing the polished surface with a solution of water, hydrogen peroxide, and ammonia in a ratio of about 4:1:1 before the surface is heated in said reactor furnace.

3. A method of growing an epitaxial layer of silicon as described in claim 1, wherein:

said step of purging said reactor furnace comprises cutting off the supply of HCl gas in said mixture, and reducing the velocity of said hydrogen gas to about 1/10 of its velocity during the etching step, until substantially all of said HCl gas is removed from said reactor furnace.

4. A method of growing an epitaxial layer of silicon as described in claim 1, wherein:

said step of purging said reactor furnace comprises cutting off the supply of said HCl gas from said mixture, dropping the temperature in said reactor furnace about 300°C, and maintaining a flow of said hydrogen gas through said reactor furnace at the same velocity as it flowed in said mixture.

* * * * *